(12) United States Patent
Jung et al.

(10) Patent No.: US 9,899,545 B2
(45) Date of Patent: Feb. 20, 2018

(54) COMPOSITION FOR FORMING SOLAR CELL ELECTRODE AND ELECTRODE PRODUCED FROM SAME

(71) Applicant: CHEIL INDUSTRIES INC., Gumi-si, Gyeongsangbuk-do (KR)

(72) Inventors: Seok Hyun Jung, Uiwang-si (KR); Koon Ho Kim, Uiwang-si (KR); Seak Cheol Kim, Uiwang-si (KR); Yong Je Seo, Uiwang-si (KR); Dong Suk Kim, Uiwang-si (KR); Ju Hee Kim, Uiwang-si (KR); Min Jae Kim, Uiwang-si (KR); Sang Hyun Yang, Uiwang-si (KR); Je Il Lee, Uiwang-si (KR)

(73) Assignee: CHEIL INDUSTRIES, INC., Gumi-Si, Gyeongsangbuk-Do (KR)

( * ) Notice: Subject to any disclaimer, the term of this patent is extended or adjusted under 35 U.S.C. 154(b) by 90 days.

(21) Appl. No.: 14/763,260

(22) PCT Filed: Mar. 27, 2014

(86) PCT No.: PCT/KR2014/002608
§ 371 (c)(1),
(2) Date: Jul. 24, 2015

(87) PCT Pub. No.: WO2014/157958
PCT Pub. Date: Oct. 2, 2014

(65) Prior Publication Data
US 2015/0364622 A1    Dec. 17, 2015

(30) Foreign Application Priority Data

Mar. 27, 2013   (KR) ......................... 10-2013-0033029
Mar. 18, 2014   (KR) ......................... 10-2014-0031876

(51) Int. Cl.
*H01L 31/0224*   (2006.01)
*H01B 1/22*       (2006.01)

(52) U.S. Cl.
CPC ....... *H01L 31/022425* (2013.01); *H01B 1/22* (2013.01); *Y02E 10/50* (2013.01)

(58) Field of Classification Search
None
See application file for complete search history.

(56) References Cited

U.S. PATENT DOCUMENTS

| 2009/0056798 | A1* | 3/2009 | Merchant | ................. H01B 1/16 136/256 |
| 2012/0305858 | A1* | 12/2012 | Hang | ....................... H01B 1/16 252/514 |

FOREIGN PATENT DOCUMENTS

| CN | 102157219 A | 8/2011 | |
| CN | 102714237 A | 10/2012 | |
| CN | 103337277 | * 10/2013 | |
| JP | 2013-235942 A | 11/2013 | |
| KR | 20100000685 A | 1/2010 | |
| KR | 20110025614 A | 3/2011 | |
| KR | 20110077731 A | 7/2011 | |
| KR | 2011-0123482 A | 11/2011 | |
| KR | 101178180 B1 | 8/2012 | |
| TW | 201037732 A1 | 10/2010 | |
| TW | 201116596 A1 | 5/2011 | |
| WO | WO 2009157727 A2 | * 12/2009 | ............... H01B 1/16 |
| WO | WO 2012138930 A2 | 10/2012 | |

OTHER PUBLICATIONS

Chinese Office action dated Apr. 8, 2016 in corresponding Chinese Patent Application No. 201480018000.2. (Jung, et al.).
Office Action dated Oct. 21, 2015 in corresponding Taiwanese Patent Application No. 103111504.
Office Action dated Dec. 12, 2016 in the corresponding Korean Patent Application No. 2014-0031876.

* cited by examiner

*Primary Examiner* — Tanisha Diggs
(74) *Attorney, Agent, or Firm* — Lee & Morse, P.C.

(57) ABSTRACT

A composition for solar cell electrodes and electrodes fabricated using the same. The composition includes silver powder; fumed silica; a glass frit; and an organic vehicle. The composition has improved contact efficiency between electrodes and a silicon wafer by introducing specific fumed silica. Solar cell electrodes fabricated using the composition exhibit minimized serial resistance, thereby providing excellent fill factor and conversion efficiency.

8 Claims, 1 Drawing Sheet

COMPOSITION FOR FORMING SOLAR CELL ELECTRODE AND ELECTRODE PRODUCED FROM SAME

CROSS REFERENCE TO RELATED APPLICATIONS

This is the U.S. national phase application based on PCT Application No. PCT/KR2014/002608, filed Mar. 27, 2014, which is based on Korean Patent Application Nos. 10-2013-0033029, filed Mar. 27, 2013, and 10-2014-0031876, filed Mar. 18, 2014, the entire contents of all of which are hereby incorporated by reference.

TECHNICAL FIELD

The present invention relates to a composition for solar cell electrodes and electrodes fabricated using the same.

BACKGROUND ART

Solar cells generate electricity using the photovoltaic effect of a p-n junction which converts photons of sunlight into electricity. In the solar cell, front and rear electrodes are formed on upper and lower surfaces of a semiconductor wafer or substrate with the p-n junctions, respectively. Then, the photovoltaic effect at the p-n junction is induced by sunlight entering the semiconductor wafer and electrons generated by the photovoltaic effect at the p-n junction provide electric current to the outside through the electrodes. The electrodes of the solar cell are formed on the wafer by applying, patterning, and baking an electrode composition.

Continuous reduction in emitter thickness to improve solar cell efficiency can cause shunting which can deteriorate solar cell performance. In addition, solar cells have gradually been increased in area to achieve higher efficiency. In this case, however, there can be a problem of efficiency deterioration due to increase in solar cell contact resistance.

Therefore, there is a need for a composition for solar cell electrodes that can enhance contact efficiency between electrodes and the silicon wafer to minimize serial resistance (Rs), thereby providing excellent conversion efficiency.

DISCLOSURE

Technical Problem

It is an aspect of the present invention to provide a composition for solar cell electrodes capable of securing excellent ohmic contact (contact efficiency) between electrodes and a silicon wafer.

It is another aspect of the present invention to provide electrodes fabricated using the composition for solar cell electrodes.

It is a further aspect of the present invention to provide solar cell electrodes fabricated using the composition which exhibit minimized serial resistance (Rs).

It is yet another aspect of the present invention to provide solar cell electrodes fabricated using the composition which have excellent fill factor and conversion efficiency.

The above and other aspects of the present invention can be achieved by the present invention described below.

Technical Solution

In accordance with one aspect of the present invention, a composition for solar cell electrodes includes silver powder; fumed silica; a glass frit; and an organic vehicle. The composition has improved contact efficiency between electrodes and a silicon wafer by introducing specific fumed silica. Solar cell electrodes fabricated using the composition exhibits minimized serial resistance, thereby providing excellent fill factor and conversion efficiency.

In accordance with another aspect of the invention, a solar cell electrode formed of the composition for solar cell electrodes is provided.

Advantageous Effects

The present invention provides a composition for solar cell electrodes capable of securing excellent ohmic contact (contact efficiency) between electrodes and surface of wafer. The solar cell electrodes fabricated using the composition can minimize serial resistance (Rs), thereby providing excellent fill factor and conversion efficiency.

BEST MODE

Composition for Solar Cell Electrodes

A composition for solar cell electrodes according to the present invention includes silver powder; fumed silica; a glass frit; and an organic vehicle. The composition has improved contact efficiency between electrodes and a silicon wafer by introducing specific fumed silica. Solar cell electrodes fabricated using the composition exhibit minimized serial resistance, thereby providing excellent fill factor and conversion efficiency.

Now, each component of the composition for solar cell electrodes according to the present invention will be described in more detail.

(A) Silver Powder

The composition for solar cell electrodes according to the invention includes silver powder as a conductive powder. The particle size of the silver powder may be on a nanometer or micrometer scale. For example, the silver powder may have a particle size of dozens to several hundred nanometers, or several to dozens of micrometers. Alternatively, the silver powder may be a mixture of two or more types of silver powders having different particle sizes.

The silver powder may have a spherical, flake or amorphous shape.

The silver powder preferably has an average particle diameter (D50) of about 0.1 μm to about 10 μm, more preferably about 0.5 μm to about 5 μm. The average particle diameter may be measured using, for example, a Model 1064D (CILAS Co., Ltd.) after dispersing the conductive powder in isopropyl alcohol (IPA) at about 25° C. for about 3 minutes via ultrasonication. Within this range of average particle diameter, the composition can provide low contact resistance and low line resistance.

The silver powder may be present in an amount of about 60 wt % to about 95 wt % based on the total weight of the composition. Within this range, the conductive powder can prevent deterioration in conversion efficiency due to increase in resistance. Advantageously, the conductive powder may be present in an amount of about 70 wt % to about 90 wt %.

(B) Fumed Silica

Figure 1:
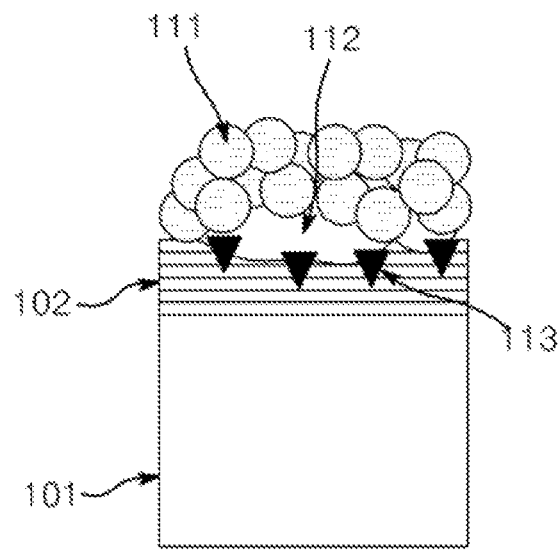
FIG. 1 is a conceptual view of a process for forming silver crystal grains by baking silver powder and a glass frit on a wafer.

Referring to FIG. 1, during the baking process for formation of electrodes, the glass frit 112 serves to etch an anti-reflection layer of a wafer, which includes a p-layer (or n-layer) 101 and an n-layer (or p-layer) 102 as an emitter, and to melt silver (Ag) particles 111, such that the melted silver particles penetrate into the surface of the wafer to form silver crystal grains 113, thereby producing the electrodes. Here, it is important to secure the depth (ohmic contact) to which the silver crystal grains are formed, and a contact area between the silver crystal grains and the wafer.

In the present invention, the fumed silica serves to form optimized ohmic contact by adjusting a degree of etching the anti-reflection layer by the glass frit, and to form a flow for minimizing diffusion of the glass frit, which can act as impurities due to etching of the anti-reflection layer, into the wafer, during the baking process.

The fumed silica is synthetic silica prepared by a drying method, and may have a high purity of about 99.9% or more. The fumed silica may be prepared by, for example, thermal decomposition of a chlorosilane compound in a gas phase.

The fumed silica may have a specific surface area of about 20 $m^2/g$ to about 500 $m^2/g$, preferably about 50 $m^2/g$ to about 200 $m^2/g$. Within this range, it is possible to adjust the degree of etching and secure the flow for minimizing diffusion of impurities into the wafer during the baking process, thereby reducing serial resistance due to the diffusion of impurities while improving fill factor and conversion efficiency. In an example embodiment, the fumed silica may have a specific surface area of about 20 $m^2/g$, 30 $m^2/g$, 40 $m^2/g$, 50 $m^2/g$, 60 $m^2/g$, 70 $m^2/g$, 80 $m^2/g$, 90 $m^2/g$, 100 $m^2/g$, 110 $m^2/g$, 120 $m^2/g$, 130 $m^2/g$, 140 $m^2/g$, 150 $m^2/g$, 160 $m^2/g$, 170 $m^2/g$, 180 $m^2/g$, 190 $m^2/g$, 200 $m^2/g$.

The fumed silica may be present in an amount of about 0.1 wt % or less, preferably from about 0.01 wt % to about 0.1 wt %, based on the total weight of the composition. When the amount of fumed silica exceeds about 0.1 wt %, the composition can suffer from deterioration in printability due to increase in viscosity. In an example embodiment, the fumed silica may be present in an amount of about 0.01 wt %, 0.02 wt %, 0.03 wt %, 0.04 wt %, 0.05 wt %, 0.06 wt %, 0.07 wt %, 0.08 wt %, 0.09 wt %, 0.1 wt %, based on the total weight of the composition.

(C) Glass Frit

The glass frit serves to enhance adhesion between the conductive powder and the wafer or the substrate and to form silver crystal grains in an emitter region by etching an anti-reflection layer and melting the silver powder so as to reduce contact resistance during the baking process of electrode paste. Further, during the baking process, the glass frit softens and decreases the baking temperature.

When the area of the solar cell is increased in order to improve solar cell efficiency, there can be a problem of increase in solar cell contact resistance. Thus, it is necessary to minimize both serial resistance (Rs) and influence on the p-n junction. In addition, as the baking temperature varies within a broad range with increasing use of various wafers having different sheet resistances, it is desirable that the glass frit secure sufficient thermal stability to withstand a wide range of baking temperatures.

The glass frit may be any of a leaded glass frit and a lead-free glass frit, which are typically used in compositions for solar cell electrodes in the art.

The glass frit may be formed of at least one of lead (Pb), tellurium (Te), bismuth (Bi), germanium (Ge), gallium (Ga), boron (B), cerium (Ce), iron (Fe), silicon (Si), zinc (Zn), tantalum (Ta), gadolinium (Gd), antimony (Sb), lanthanum (La), neodymium (Nd), selenium (Se), yttrium (Y), phosphorus (P), chrome (Cr), lithium (Li), tungsten (W), magnesium (Mg), cesium (Cs), strontium (Sr), molybdenum (Mo), titanium (Ti), tin (Sn), indium (In), vanadium (V), barium (Ba), nickel (Ni), copper (Cu), sodium (Na), potassium (K), arsenic (As), cobalt (Co), zirconium (Zr), manganese (Mn), and aluminum (Al) oxides.

In one embodiment, the glass frit may be Pb—Si—O, Pb—Si—Al—O, Pb—Si—Al—P—O, Pb—Si—Al—Zn—O, Pb—Bi—O, Zn—Si—O, Zn—B—Si—O, Zn—B—Si—Al—O, Bi—Si—O, Bi—B—Si—O, Bi—B—Si—Al—O, Bi—Zn—B—Si—O, Bi—Zn—B—Si—Al—O, Pb—Te—O, Pb—Te—Bi—O, Pb—Te—Si—O, Pb—Te—Li—O, Bi—Te—O, Bi—Te—Si—O, or Bi—Te—Li—O-based glass frits. Herein, the Pb—Si—O-based glass frit is defined as a glass frit prepared from metal oxides including lead (Pb) oxide and silicon (Si) oxide, and includes elemental lead and elemental silicon. All of the glass frits listed above are to be defined in the same manner as this definition.

In another embodiment, the Bi—Te—O-based glass frit may be prepared from metal oxides including bismuth oxide and tellurium oxide. The Bi—Te—O-based glass frit may include elemental bismuth (Bi) and elemental tellurium. Here, a mole ratio of Bi to Te may range from about 1:0.1 to about 1:50, preferably from about 1:0.5 to about 1:30, more preferably from about 1:1 to about 1:20. Within this range, it is possible to secure low serial resistance and contact resistance. In an example embodiment, a mole ratio of Bi to Te may be about 1:0.1, 1:0.2, 1:0.3, 1:0.4, 1:0.5, 1:0.6, 1:0.7, 1:0.8, 1:0.9, 1:1.0, 1:2, 1:3, 1:4, 1:5, 1:6, 1:7, 1:8, 1:9, 1:10, 1:15, 1:20, 1:25, 1:30, 1:35, 1:40, 1:45, 1:50. As used herein, the mole ratio means an elemental mole ratio of each of the metal components.

The glass frit may have an average particle diameter D50 of about 0.1 μm to about 20 μm, and may be present in an amount of about 0.5 wt % to about 20 wt % based on the total weight of the composition. The glass frit may have a spherical or amorphous shape.

In still another embodiment, a mixture of two types of glass frits having different glass transition temperatures may be used for the composition. For example, a mixture of a first glass frit having a glass transition temperature ranging from about 200° C. to about 320° C. and a second glass frit having a glass transition temperature ranging from about 300° C. to about 550° C. may be used, wherein the weight ratio of the first glass frit to the second glass frit may range from about 1:0.2 to about 1:1.

The glass frit may be commercially available products, or, in order to obtain a desired composition, may be prepared by melting, for example, silicon dioxide ($SiO_2$), aluminum oxide ($Al_2O_3$), boron oxide ($B_2O_3$), bismuth oxide ($Bi_2O_3$), sodium oxide ($Na_2O$), zinc oxide (ZnO), or the like.

(D) Organic Vehicle

The organic vehicle imparts suitable viscosity and rheological characteristics for printing to the composition for solar cell electrodes through mechanical mixing with the inorganic component of the composition.

The organic vehicle may be any typical organic vehicle used in solar cell electrode compositions, and may include a binder resin, a solvent, and the like.

The binder resin may be selected from acrylate resins or cellulose resins. Ethylcellulose is generally used as the binder resin. In addition, the binder resin may be selected from among ethyl hydroxyethylcellulose, nitrocellulose, blends of ethylcellulose and phenol resins, alkyd, phenol, acrylate ester, xylene, polybutane, polyester, urea, melamine, vinyl acetate resins, wood rosin, polymethacrylates of alcohols, and the like.

The solvent may comprise at least one of, for example, hexane, toluene, ethyl cellosolve, cyclohexanone, butyl cellosolve, butyl carbitol (diethylene glycol monobutyl ether), dibutyl carbitol (diethylene glycol dibutyl ether), butyl carbitol acetate (diethylene glycol monobutyl ether acetate), propylene glycol monomethyl ether, hexylene glycol, terpineol, methylethylketone, benzyl alcohol, γ-butyrolactone, ethyl lactate, and combinations thereof.

The organic vehicle may be present in an amount of about 1 wt % to about 30 wt % based on the total weight of the composition. Within this range, the organic vehicle can provide sufficient adhesive strength and excellent printability to the composition.

(E) Additives

The composition may further include typical additives to enhance flow and process properties and stability, as needed. The additives may include dispersants, thixotropic agents, plasticizers, viscosity stabilizers, anti-foaming agents, pigments, UV stabilizers, antioxidants, coupling agents, and the like, without being limited thereto. These additives may be used alone or as mixtures thereof. These additives may be present in the composition in an amount of about 0.1 wt % to about 5 wt %, without being limited thereto.

Solar Cell Electrode and Solar Cell Including the Same

Figure 2:
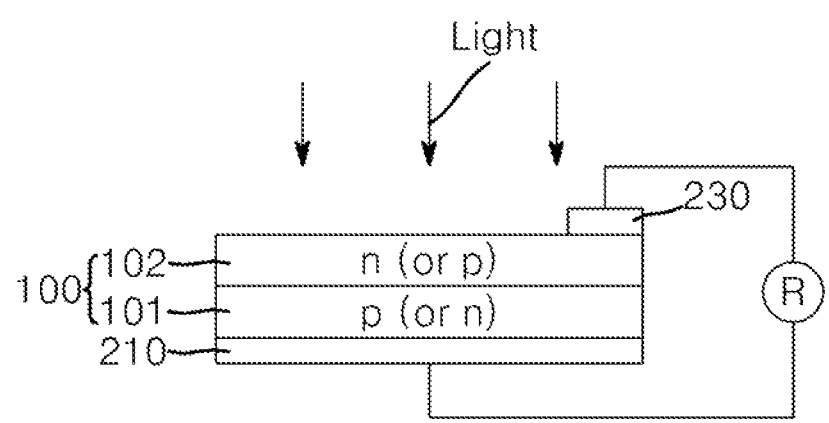
FIG. 2 is a schematic view of a solar cell in accordance with one embodiment of the present invention.

Other aspects of the invention relate to an electrode formed of the composition for solar cell electrodes and a solar cell including the same. FIG. 2 shows a solar cell in accordance with one embodiment of the invention.

Referring to FIG. 2, a rear electrode 210 and a front electrode 230 may be formed by printing and baking the composition on a wafer or substrate 100 that includes a p-layer (or n-layer) 101 and an n-layer (or p-layer) 102, which will serve as an emitter. For example, a preliminary process of preparing the rear electrode 210 is performed by printing the composition on the rear surface of the wafer 100 and drying the printed composition at about 200° C. to about 400° C. for about 10 to 60 seconds. Further, a preliminary process for preparing the front electrode may be performed by printing the paste on the front surface of the wafer and drying the printed composition. Then, the front electrode 230 and the rear electrode 210 may be formed by baking the wafer at about 400° C. to about 950° C., preferably at about 850° C. to about 950° C., for about 30 to about 50 seconds.

MODE FOR INVENTION

Next, the present invention will be described in more detail with reference to examples. However, it should be noted that these examples are provided for illustration only and should not be construed in any way as limiting the invention.

Examples 1 to 5 and Comparative Examples 1 to 8

Example 1

As an organic binder, 1.0 wt % of ethylcellulose (STD4, Dow Chemical Company) was sufficiently dissolved in 6.69 wt % of Texanol (Texanol ester-alcohol, Eastman Chemical Company) at 60° C., and 89 wt % of spherical silver powder (AG-4-8, Dowa Hightech Co., Ltd.) having an average particle diameter of 2.0 μm, 2.5 wt % of a Pb—Si—Al—O-based low melting point leaded glass frit having an average particle diameter of 1.0 μm and a transition temperature of 350° C., 0.01 wt % of fumed silica (Aerosil® 200, Evonik Co., Ltd.) having a BET specific surface area of 200±25 m²/g, 0.4 wt % of a dispersant (BYK102, BYK-chemie), and 0.4 wt % of a thixotropic agent (Thixatrol® ST, Elementis Co., Ltd.) were added to the binder solution, followed by mixing and kneading in a 3-roll kneader, thereby preparing a composition for solar cell electrodes.

The composition was deposited over a front surface of a wafer having a sheet resistance of 85 Ω/sq. by screen printing in a predetermined pattern, followed by drying in an IR drying furnace. Then, an aluminum paste was printed on a rear side of the wafer and dried in the same manner as above. Cells formed according to this procedure were subjected to baking at 400° C. to 900° C. for 30 to 50 seconds in a belt-type baking furnace, and evaluated as to fill factor (FF, %) and conversion efficiency (%) using a solar cell efficiency tester CT-801 (Pasan Co., Ltd.). The measured fill factor and conversion efficiency are shown in Table 1.

Examples 2 to 3

Compositions for solar cell electrodes were prepared in the same manner as in Example 1 except that the compositions were prepared in amounts as listed in Table 1. Solar cell electrodes were formed by printing the compositions and then evaluated as to fill factor (FF, %) and conversion efficiency (%). Results are shown in Table 1.

Example 4

A composition for solar cell electrodes was prepared in the same manner as in Example 1 except that the composition was prepared using a Pb—Te—Bi-based glass frit in a mole ratio of Pb to Te of 1:2 and in amounts as listed in Table 1. Solar cell electrodes were formed by printing the composition and then evaluated as to fill factor (FF, %) and conversion efficiency (%). Results are shown in Table 1.

Example 5

A composition for solar cell electrodes was prepared in the same manner as in Example 1 except that the composition was prepared using a Pb—Te—Bi-based glass frit having a mole ratio of Pb to Te of 1:1.5 and in amounts as listed in Table 1. Solar cell electrodes were formed by printing the composition and then evaluated as to fill factor (FF, %) and conversion efficiency (%). Results are shown in Table 1.

Comparative Examples 1 to 8

Compositions for solar cell electrodes were prepared in the same manner as in Example 1 except that the compositions were prepared in amounts as listed in Table 1. Solar cell electrodes were formed by printing the compositions and then evaluated as to fill factor (FF, %) and conversion efficiency (%). Results are shown in Table 1.

TABLE 1

|  | Example | | | | | Comparative Example | | | | | | | |
|---|---|---|---|---|---|---|---|---|---|---|---|---|---|
|  | 1 | 2 | 3 | 4 | 5 | 1 | 2 | 3 | 4 | 5 | 6 | 7 | 8 |
| Silver (Ag) powder | 89 | 89 | 89 | 89 | 89 | 89 | 89 | 89 | 89 | 89 | 89 | 89 | 89 |
| Glass frit | 2.5 | 2.5 | 2.5 | 2.5 | 2.5 | 2.5 | 2.5 | 2.5 | 2.5 | 2.5 | 2.5 | 2.5 | 2.5 |
| Inorganic substance Fumed silica | 0.01 | 0.05 | 0.10 | 0.01 | 0.01 | — | — | — | — | — | — | — | 0.15 |
| $Co_3O_4$ | — | — | — | — | — | 0.05 | — | — | — | — | — | — | — |
| $V_2O_5$ | — | — | — | — | — | — | 0.05 | — | — | — | — | — | — |
| $Al_2O_3$ | — | — | — | — | — | — | — | 0.05 | — | — | — | — | — |
| $TiO_2$ | — | — | — | — | — | — | — | — | 0.05 | — | — | — | — |
| $Sb_2O_3$ | — | — | — | — | — | — | — | — | — | 0.05 | — | — | — |
| $SiO_2$ | — | — | — | — | — | — | — | — | — | — | 0.05 | — | — |
| Binder | 1.0 | 1.0 | 1.0 | 1.0 | 1.0 | 1.0 | 1.0 | 1.0 | 1.0 | 1.0 | 1.0 | 1.0 | 1.0 |
| Solvent | 6.69 | 6.65 | 6.60 | 6.69 | 6.69 | 6.65 | 6.65 | 6.65 | 6.65 | 6.65 | 6.65 | 6.70 | 6.55 |
| Additives | 0.8 | 0.8 | 0.8 | 0.8 | 0.8 | 0.8 | 0.8 | 0.8 | 0.8 | 0.8 | 0.8 | 0.8 | 0.8 |
| Fill factor (%) | 76.2 | 75.9 | 74.5 | 77.1 | 77.5 | 42.6 | 34.7 | 68.1 | 69.1 | 65.4 | 44.5 | 72.2 | 62.8 |
| Efficiency (%) | 17.5 | 17.4 | 17.1 | 17.7 | 17.8 | 9.8 | 8.0 | 15.6 | 15.9 | 15.0 | 10.2 | 16.6 | 14.4 |

As shown in Table 1, it can be seen that the solar cell electrodes fabricated using ultra-fine fumed silica having a particular specific surface area in Examples 1 to 5 had a considerably increased fill factor, and thus provided excellent conversion efficiency, as compared with those of Comparative Examples 1 to 6 in which inorganic substances other than the fumed silica were used and Comparative Example 7 in which no inorganic substance was used. This resulted from the fact that the fumed silica used in Examples formed optimized ohmic contact during the baking process and minimized penetration or diffusion of glass frit-phase impurities into the wafer. In addition, it can be seen that, for the composition of Comparative Example 8 in which an excess of fumed silica was used, the viscosity was considerably increased, thereby causing deterioration in printability, fill factor and conversion efficiency.

Examples 6 to 8 and Comparative Examples 9 to 10

Example 6

As an organic binder, 1.0 wt % of ethylcellulose (STD4, Dow Chemical Company) was sufficiently dissolved in 6.69 wt % of Texanol (Texanol ester-alcohol, Eastman Chemical Company) at 60° C., and 89 wt % of spherical silver powder (AG-5-11F, Dowa Hightech Co., Ltd.) having an average particle diameter of 2.5 μm, 2.5 wt % of a Bi—Te—O-based glass frit having a composition in Table 2, 0.01 wt % of fumed silica (Aerosil® 200, Evonik Co., Ltd.) having a BET specific surface area of 200±25 $m^2/g$, 0.4 wt % of a dispersant (BYK102, BYK-chemie), and 0.4 wt % of a thixotropic agent (Thixatrol® ST, Elementis Co., Ltd.) were added to the binder solution, followed by mixing and kneading in a 3-roll kneader, thereby preparing a composition for solar cell electrodes.

The composition was deposited over a front surface of a wafer having a sheet resistance of 85 Ω/sq. by screen printing in a predetermined pattern, followed by drying in an IR drying furnace. Then, an aluminum paste was printed on a rear side of the wafer and dried in the same manner as above. Cells formed according to this procedure were subjected to baking at 400 to 900° C. for 30 to 50 seconds in a belt-type baking furnace, and evaluated as to fill factor (FF, %) and conversion efficiency (%) using a solar cell efficiency tester CT-801 (Pasan Co., Ltd.). The measured fill factor and conversion efficiency are shown in Table 3.

Examples 7 to 8

Compositions for solar cell electrodes were prepared in the same manner as in Example 6 except that the compositions were prepared in amounts as listed in Table 3. Solar cell electrodes were formed by printing the compositions and then evaluated as to properties. Results are shown in Table 2.

Comparative Example 9

A composition for solar cell electrodes was prepared in the same manner as in Example 6 except that the composition was prepared in amounts as listed in Table 3. Solar cell electrodes were formed by printing the composition and then evaluated as to properties. Results are shown in Table 3.

Comparative Example 10

A composition for solar cell electrodes was prepared in the same manner as in Example 6 except that the composition was prepared using a Bi—Te—O-based glass frit having a mole ratio of Bi to Te of 1:60. Solar cell electrodes were formed by printing the composition and then evaluated as to properties. Results are shown in Table 3.

TABLE 2

|  | Composition of glass frit (unit: wt %) | | | | | | | | | Mole ratio |
|---|---|---|---|---|---|---|---|---|---|---|
|  | $Bi_2O_3$ | $TeO_2$ | ZnO | $Li_2O$ | $WO_3$ | SiO2 | P2O5 | Al2O3 | PbO | (Bi:Te) |
| Glass frit I | 5.0 | 65.0 | 15.0 | 5.0 | 10.0 | — | — | — | — | 1:11.59 |
| Glass frit II | 11.5 | 69.5 | 6.5 | 2.5 | 10.0 | — | — | — | — | 1:5.38 |
| Glass frit III | 20.0 | 55.0 | 15.0 | 0.1 | 9.9 | — | — | — | — | 1:2.45 |
| Glass frit IV | 1.0 | 67.3 | 15.0 | 6.7 | 10.0 | — | — | — | — | 1:59.96 |

TABLE 3

|  | Example | | | Comparative Example | |
| --- | --- | --- | --- | --- | --- |
|  | 6 | 7 | 8 | 9 | 10 |
| Glass (Ag) frit | 89 | 89 | 89 | 89 | 89 |
| Fumed silica | 0.01 | 0.05 | 0.1 | — | 0.01 |
| Glass frit I | 2.5 | — | — | — | — |
| II | — | 2.5 | — | — | — |
| III | — | — | 2.5 | — | — |
| IV | — | — | — | — | 2.5 |
| Binder | 1 | 1 | 1 | 1 | 1 |
| Solvent | 6.69 | 6.65 | 6.6 | 9.3 | 6.69 |
| Additives | 0.8 | 0.8 | 0.8 | 0.8 | 0.8 |
| Voc(V) | 0.6241 | 0.6250 | 0.6254 | 0.6215 | 0.6243 |
| Fill factor (%) | 77.40 | 77.35 | 77.08 | 76.40 | 70.10 |
| Efficiency (%) | 17.87 | 17.89 | 17.84 | 17.57 | 16.19 |

(unit: wt %)

As shown in Table 3, it can be seen that the solar cell electrodes fabricated from the compositions prepared using a glass frit including fumed silica as well as elemental bismuth (Bi) and elemental tellurium (Te) in Examples 6 to 8 had excellent fill factor and conversion efficiency, as compared with those of Comparative Example 9 in which no fumed silica was used and Comparative Example 10 in which a mole ratio of bismuth to tellurium was higher than 1:50.

It should be understood that various modifications, changes, alterations, and equivalent embodiments can be made by those skilled in the art without departing from the spirit and scope of the present invention.

The invention claimed is:

1. A composition for solar cell electrodes, the composition comprising:
   about 60 wt % to about 95 wt % of silver powder;
   0.01 wt % to 0.1 wt % of fumed silica;
   about 0.5 wt % to about 20 wt % of glass frit; and
   about 1 wt % to about 30 wt % or organic vehicle,
   wherein the glass frit includes at least one of a Pb—Si—Al—O glass frit, a Pb—Te—O glass frit, a Pb—Te—Bi—O glass frit, and a Bi—Te—O glass frit.

2. The composition according to claim 1, wherein the fumed silica has a specific surface area (BET) of about 20 $m^2/g$ to about 300 $m^2/g$.

3. The composition according to claim 1, wherein the glass frit is a Bi—Te—O glass frit having a mole ratio of Bi to Te of about 1:0.1 to about 1:50.

4. The composition according to claim 1, wherein the glass frit further includes at least one of germanium (Ge) oxide, gallium (Ga) oxide, boron (B) oxide, cerium (Ce) oxide, iron (Fe) oxide, silicon (Si) oxide, zinc (Zn) oxide, tantalum (Ta) oxide, gadolinium (Gd) oxide, antimony (Sb) oxide, lanthanum (La) oxide, neodymium (Nd) oxide, selenium (Se) oxide, yttrium (Y) oxide, phosphorus (P) oxide, chromium (Cr) oxide, lithium (Li) oxide, tungsten (W) oxide, magnesium (Mg) oxide, cesium (Cs) oxide, strontium (Sr) oxide, molybdenum (Mo) oxide, titanium (Ti) oxide, tin (Sn) oxide, indium (In) oxide, vanadium (V) oxide, barium (Ba) oxide, nickel (Ni) oxide, copper (Cu) oxide, sodium (Na) oxide, potassium (K) oxide, arsenic (As) oxide, cobalt (Co) oxide, zirconium (Zr) oxide, manganese (Mn) oxide, and aluminum (Al) oxide.

5. The composition according to claim 1, wherein the glass frit has an average particle diameter D50 from about 0.1 µm to about 20 µm.

6. The composition according to claim 1, further comprising: at least one of a dispersant, a thixotropic agent, a plasticizer, a viscosity stabilizer, an anti-foaming agent, a pigment, a UV stabilizer, an antioxidant, or a coupling agent.

7. A solar cell electrode prepared from the composition for solar cell electrodes according to claim 1.

8. The composition according to claim 1, wherein the fumed silica is present in an amount of 0.01 wt % to less than 0.1 wt %, based on a total weight of the composition.

* * * * *